(12) United States Patent
Park et al.

(10) Patent No.: US 7,035,351 B1
(45) Date of Patent: Apr. 25, 2006

(54) AUTOMATIC GAIN CONTROL LOOP APPARATUS

(75) Inventors: Joonbae Park, Seoul (KR); Wonchan Kim, Seoul (KR); Kyeongho Lee, Seoul (KR); Deog-Kyoon Jeong, Seoul (KR)

(73) Assignee: GCT Semiconductor, Inc., San Jose, CA (US)

( * ) Notice: Subject to any disclaimer, the term of this patent is extended or adjusted under 35 U.S.C. 154(b) by 451 days.

(21) Appl. No.: 09/705,696

(22) Filed: Nov. 6, 2000

Related U.S. Application Data

(63) Continuation-in-part of application No. 09/121,863, filed on Jul. 24, 1998, now Pat. No. 6,194,947, and a continuation-in-part of application No. 09/121,601, filed on Jul. 24, 1998, now Pat. No. 6,335,952.

(60) Provisional application No. 60/164,874, filed on Nov. 12, 1999.

(51) Int. Cl.
*H03D 3/18* (2006.01)

(52) U.S. Cl. .................................................. 375/327

(58) Field of Classification Search ................ 375/215, 375/294, 327, 326, 254, 344, 345, 373, 376, 375/297, 307, 318; 435/138, 136, 146, 147, 435/230, 219, 240.1, 247.1, 250.1, 232.1, 435/251.1; 330/279, 129, 88, 84, 86, 294, 330/99, 107; 331/17, 8, 25; 455/260, 78, 455/81, 313, 305
See application file for complete search history.

(56) References Cited

U.S. PATENT DOCUMENTS

| | | | | |
|---|---|---|---|---|
| 4,217,506 A | * | 8/1980 | Sawyer et al. ................. 327/78 |
| 4,506,232 A | * | 3/1985 | Thompson .................... 331/16 |
| 4,731,590 A | | 3/1988 | Saari .......................... 330/278 |
| 4,752,749 A | * | 6/1988 | Moger .......................... 331/17 |
| 4,755,774 A | | 7/1988 | Heck ............................ 332/18 |
| 4,788,512 A | * | 11/1988 | Hogge et al. ................... 331/4 |
| 4,856,085 A | | 8/1989 | Horvat ....................... 455/315 |
| 4,952,887 A | * | 8/1990 | Ashley .......................... 331/17 |
| 5,012,142 A | | 4/1991 | Sonntag ....................... 327/158 |
| 5,175,729 A | | 12/1992 | Borras et al. ............... 370/345 |
| 5,179,303 A | | 1/1993 | Searles et al. ............. 327/277 |
| 5,180,994 A | | 1/1993 | Martin et al. ................. 331/38 |
| 5,313,169 A | * | 5/1994 | Fouche et al. ............. 329/302 |
| 5,321,852 A | * | 6/1994 | Seong ....................... 455/182.1 |
| 5,371,479 A | * | 12/1994 | Hagerty ....................... 330/294 |
| 5,404,588 A | * | 4/1995 | Henze ....................... 455/186.1 |
| 5,408,201 A | | 4/1995 | Uriya ............................. 331/2 |
| 5,414,741 A | * | 5/1995 | Johnson ....................... 375/376 |
| 5,418,815 A | | 5/1995 | Ishikawa et al. ............. 375/216 |
| 5,438,591 A | | 8/1995 | Oie et al. .................... 375/261 |
| 5,448,772 A | | 9/1995 | Grandfield ................... 327/357 |
| 5,507,025 A | | 4/1996 | Rodeffer ..................... 455/266 |
| 5,513,387 A | * | 4/1996 | Saito et al. ............... 455/243.1 |
| 5,548,831 A | * | 8/1996 | Bijker et al. ................. 455/207 |
| 5,553,151 A | * | 9/1996 | Goldberg ..................... 381/312 |
| 5,555,182 A | | 9/1996 | Galm ............................ 702/69 |
| 5,584,062 A | | 12/1996 | Meador et al. ............. 455/260 |
| 5,608,351 A | * | 3/1997 | Ward ........................... 330/107 |
| 5,614,868 A | | 3/1997 | Nielson ....................... 331/1 A |
| 5,640,146 A | | 6/1997 | Campana et al. .......... 455/54.1 |

(Continued)

*Primary Examiner*—Emmanuel Bayard
(74) *Attorney, Agent, or Firm*—Fleshner & Kim, LLP

(57) ABSTRACT

A DC offset cancelling circuit with multiple feedback loops suppresses DC offset voltages within an automatic gain control loop apparatus. The apparatus includes a plurality of gain stages connected in series that receive and amplify an input RF signal. Each gain stage includes a corresponding feedback loop to filter the DC offset voltage accumulated in the respective gain stage.

30 Claims, 3 Drawing Sheets

U.S. PATENT DOCUMENTS

| | | | | |
|---|---|---|---|---|
| 5,703,292 A | * | 12/1997 | Ward | 73/504.02 |
| 5,715,529 A | * | 2/1998 | Kianush et al. | 455/266 |
| 5,722,062 A | * | 2/1998 | Nakanishi et al. | 455/247.1 |
| 5,734,970 A | | 3/1998 | Saito | 455/76 |
| 5,737,033 A | * | 4/1998 | Masuda | 348/678 |
| 5,761,617 A | | 6/1998 | Yonekura et al. | 455/343 |
| 5,794,119 A | | 8/1998 | Evans et al. | 455/71 |
| 5,861,773 A | | 1/1999 | Meyer | 329/304 |
| 5,872,810 A | | 2/1999 | Philips et al. | 375/222 |
| 5,874,862 A | * | 2/1999 | Clarke et al. | 331/17 |
| 5,878,087 A | | 3/1999 | Ichihara | 375/316 |
| 5,880,613 A | | 3/1999 | Ishihara | 327/202 |
| 5,889,437 A | | 3/1999 | Lee | 331/16 |
| 5,894,592 A | | 4/1999 | Brueske et al. | 455/86 |
| 5,930,693 A | * | 7/1999 | Kennedy et al. | 455/234.1 |
| 5,940,143 A | * | 8/1999 | Igarashi et al. | 348/678 |
| 5,940,757 A | * | 8/1999 | Callaway, Jr. | 455/426.1 |
| 5,950,119 A | | 9/1999 | McGeehan et al. | 455/302 |
| 5,963,855 A | | 10/1999 | Lussenhop et al. | 455/226.2 |
| 6,029,059 A | | 2/2000 | Bojer | 327/361 |
| 6,049,702 A | * | 4/2000 | Tham et al. | 455/78 |
| 6,073,848 A | * | 6/2000 | Giebel | 235/462.26 |
| 6,084,905 A | | 7/2000 | Ishifuji et al. | 375/202 |
| 6,097,768 A | | 8/2000 | Janesch et al. | 375/330 |
| 6,169,452 B1 | | 1/2001 | Popescu et al. | 330/254 |
| 6,175,279 B1 | | 1/2001 | Ciccarelli et al. | 330/296 |
| 6,194,947 B1 | | 2/2001 | Lee et al. | 327/359 |
| 6,397,038 B1 | * | 5/2002 | Green et al. | 455/3.02 |
| 6,516,187 B1 | * | 2/2003 | Williams et al. | 455/313 |
| 6,711,418 B1 | * | 3/2004 | Wang et al. | 455/553.1 |

\* cited by examiner

AUTOMATIC GAIN CONTROL LOOP APPARATUS

This application is a CIP of Ser. No. 09/121,863 filed Jul. 24, 1998, now U.S. Pat. No. 6,194,947 and is a CIP of Ser. No. 09/121,601 filed Jul. 24, 1998 now U.S. Pat. No. 6,335,952 and claims benefit of Ser. No. 60/164,874 filed Nov. 12, 1999.

BACKGROUND OF THE INVENTION

1. Field of the Invention

The present invention relates to an automatic gain control loop, and more particularly, to an automatic gain control loop with a feedback loop.

2. Background of the Related Art

Presently, for radio frequency (RF) receivers, one of two different types of RF architectures, super-heterodyne and direct conversion are used for RF implementation. Generally direct conversion is considered to have the more straight forward approach. Unlike a super heterodyne receiver, a direct conversion receiver directly demodulates a desired signal to a base band signal, and does not need image filtering and Intermediate Frequency Surface Acoustic Wave (IF SAW) filtering. A low pass filter is typically used for channel selection, and thus the direct conversion receiver can be fully integrated. However, despite these architectural advantages, several practical problems, such as channel selection quality and direct current (DC) offsets have limited the availability of direct conversion receivers as commercial products.

FIG. 1 is a general block diagram of a direct conversion receiver 1. An incoming analog RF signal is amplified at a first amplifier stage by a low noise amplifier (LNA) 10. After this front-end amplification, the RF signal is demodulated into the base band signal by a mixer 20 that combines the RF signal with a local oscillation (LO) signal. The demodulated base band signal may be amplified by a post-mixer amplifier 30 and filtered by a channel selection filter 40, for eliminating out-of-band signals. The filtered base band signal is amplified by a second post filter amplifier 50, and is converted to a digital data stream by an analog-to-digital converter (ADC) 60.

Gain assignment and linearity are very important design factors for the direct conversion receiver 1, because channel selection is generally provided at a latter phase of the signal processing. Therefore, amplifiers, here shown as a post-mixer amplifier 30 and post-filter amplifier 50, are generally added to maximize the signal-to-noise ratio (SNR) and dynamic range before and after the channel selection filter 40.

An incoming RF has a time-varying magnitude in its amplitude, and needs gain control to maximize its dynamic range. This gain control should be provided prior to the channel selection filter 40. As shown in FIG. 1, the gain control is provided at the first amplifying stage by replacing the low noise amplifier LNA 10 with an automatic gain controller (AGC). However, since the input signal strength of an AGC can be very small, an input signal having a large input offset and path mismatch can corrupt the desired signal, and saturate the down steam stages.

For example, signal feedthrough leaks can occur at the low noise amplifier 10 input port and at the mixer 20 input port for the local oscillation signal, possibly from capacitor and substrate coupling. This feedthrough (or LO leakage), is mixed with the LO signal, and produces DC offsets. A similar effect occurs when interference leaks from the inputs of the low noise amplifier 10 or the mixer 20, and is multiplied by itself. Further, low frequency device noises, such as 1/f noise and transistor mismatches, contributes to DC offsets. The amount of the produced DC offset voltage can be greater than the input RF signal by more than several tens of dB. If this offset voltage is amplified by down stream gain stages, the amplified offset voltage can saturate the down stream circuits, prohibiting the amplification of the desired signal.

Accordingly, the related art direct conversion receiver 1 requires DC offset cancellation. The related art approach for DC offset cancellation uses a high-pass filtering of the DC offset voltage incorporated within the gain stages. The integration of the high-pass filtering depends on the corner frequency and the amount of DC offset rejection. Since the spectrum of DC offset is restricted around zero frequency, and the high-pass filtering must not impair the desired signal, the desired corner frequency should be as low as possible.

FIGS. 2a–2b show a related art DC offset cancelling circuit 100, having a single feedback loop 120, for providing high pass filtering of a DC offset. The DC offset cancelling circuit 100 includes a plurality of variable gain amplifiers (VGAs) 110 connected in series, and a DC offset cancelling loop 120 connected to an input port of the first VGA 110 and an output port of the last VGA 110. The DC offset cancelling loop 120 includes a DC offset cancelling circuit 130, which is a high pass filter. In FIGS. 2a and 2b, the incoming signal having a voltage $V_{in}$ is amplified by the variable gain amplifiers (VGA #1, . . . , VGA #N) to the level of an open-loop forward gain $A_v$, and is subjected to a gain of the DC offset cancelling loop $A_{v,DC}$, a DC offset gain $G_m$, and a capacitance C of the capacitor 180.

An overall transfer function is shown at Equation 1 as:

$$\frac{V_o}{V_{in}} = \frac{sA_v}{s + \frac{g_m A_v A_{v,DC}}{C}} \quad (1)$$

The AGC loop 100 has a corner frequency $f_c$ shown at Equation 2 as:

$$f_c = \frac{g_m A_v A_{v,DC}}{2\pi C} \quad (2)$$

The capacitance C of the DC offset cancelling loop 120 increases as the corner frequency $f_c$ decreases and the open loop forward gain $A_v$ increases. The capacitance C value typically reaches several hundred of nF, and it is difficult to integrate a capacitor of this value on a single chip. Thus, the capacitor C is typically located at the outside of the chip. Unfortunately, when the off-chip capacitor is wired to the chip, a feedback connection is established, and some amount of noise is added via the bond wire coupling. This noise corrupts the signal integrity and degrades the signal-to-noise ratio (SNR).

For example, according to the above equation 1, the DC offset is reduced at a slope of 20 dB/decade from the corner frequency $f_c$. Rather than suppressing noise, this attenuation of DC offsets often amplifies noise at low frequency. For example, when the corner frequency $f_c$ is 100 KHz and the open loop forward gain $A_v$ is 80 dB, the offset signal at 100 Hz is amplified by 20 bB. Moreover, lowering the corner frequency $f_c$ provides the undesirable effect of reducing the amount of DC offset rejection. Accordingly, related art AGC loops do not simultaneously provide low corner frequency with a high amount of DC offset rejection.

SUMMARY OF THE INVENTION

An object of the invention is to at least substantially obviate the above problems and/or disadvantages of the related art, and to provide at least the advantages described hereinafter.

A further object of the present invention is to provide a DC offset cancelling apparatus.

Another object of the present invention is to simultaneously provide a lower corner frequency and high DC offset voltage rejection.

Still another object of the present invention is to provide a single chip bypass filter.

Yet another object of the present invention is to decrease a total capacitance of an AGC loop as the number of gain stages increase.

To achieve the advantages and in accordance with a purpose of the present invention, as embodied and broadly described, the structure of the invention includes a plurality of gain stages connected in series, that receive and amplify an input RF signal; and a plurality of feedback loops, wherein each feedback loop corresponds to respective ones of the gain stages, and is connected to an input port and output port of the respective gain stage, to filter an offset voltage.

To achieve the advantages and in accordance with a purpose of the present invention, as embodied and broadly described, the invention includes a method for controlling a gain of a signal that includes amplifying the voltage of a signal by propagating the signal through a plurality of gain stages connected in series, wherein each gain stage increases the voltage of the signal, and includes an input port receiving the signal and an output port transmitting the resulting amplified signal and canceling an undesired offset of the resulting amplified signal with a plurality of feedback loops, wherein each feedback loop connects to the output port and the input port of a corresponding one of the gain stages, such that each gain stage is connected to a corresponding feedback loop that cancels the undesired offset of its corresponding gain stage.

To achieve the advantages and in accordance with a purpose of the present invention, as embodied and broadly described, the invention includes a direct conversion receiver that includes an amplification unit that receives and amplifies a signal, wherein the amplification unit includes a plurality of gain stages connected in series to amplify the signal having a voltage, wherein each gain stage increases the voltage of the signal, and includes an input port that receives the signal and an output port that transmits the resulting amplified signal and a plurality of feedback loops that cancel an undesired offset of the resulting amplified signal, wherein each feedback loop connects to the output port and the input port of a corresponding one of the gain stages, such that each gain stage is connected to a corresponding feedback loop that cancels the undesired offset of its corresponding gain stage and a mixer that demodulates the amplified signal by mixing the amplified signal with a local oscillation signal to form a demodulated baseband signal.

Additional advantages, objects, and features of the invention will be set forth in part in the description which follows and in part will become apparent to those having ordinary skill in the art upon examination of the following, or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings, in which like reference numerals refer to like elements, and wherein:

FIG. 2b is a schematic diagram of the DC offset cancelling circuit of FIG. 2a;

FIG. 3b is a schematic diagram of the DC offset cancelling circuit of FIG. 3a.

DETAILED DESCRIPTION OF PREFERRED EMBODIMENTS

Figure 1:
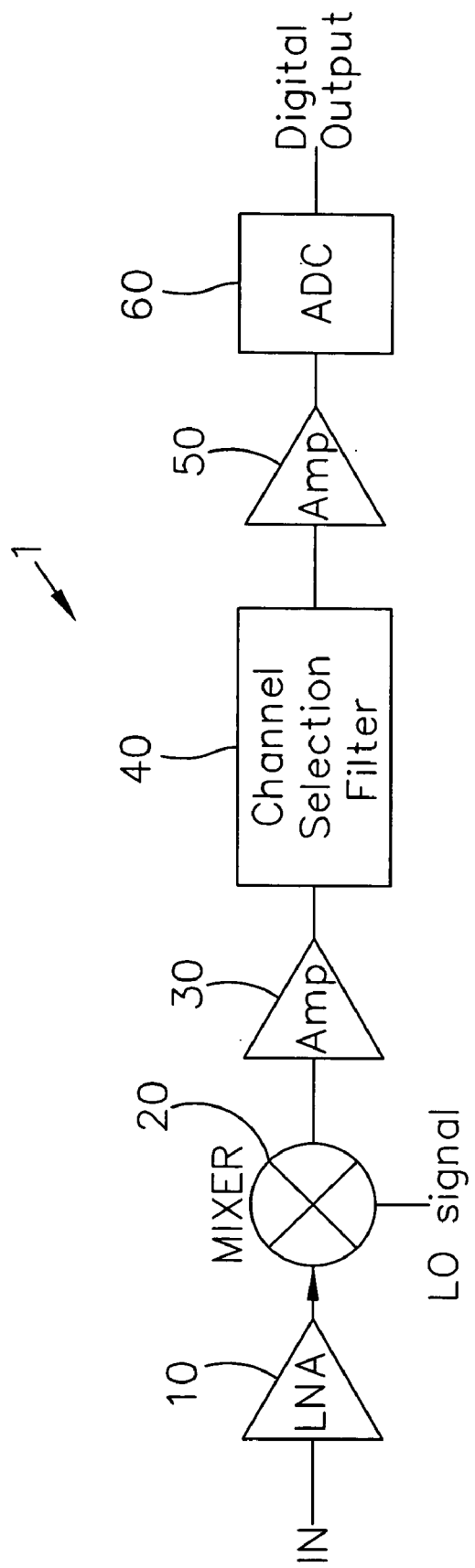
FIG. 1 is a block diagram of a direct conversion receiver according to the related art.
Figure 2A:
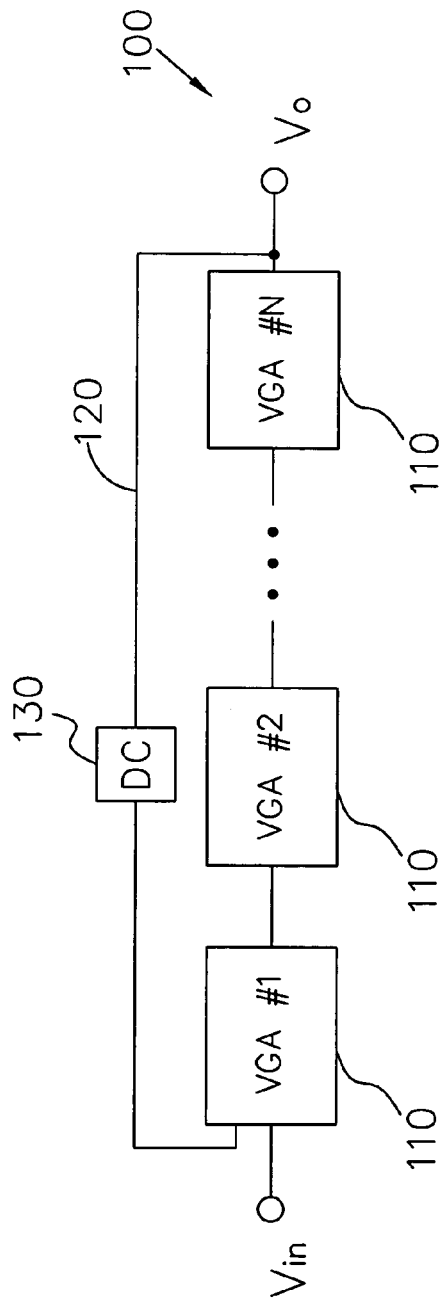
FIG. 2a is a block diagram of a DC offset cancelling circuit with a single feedback loop according to the related art.
Figure 2B:
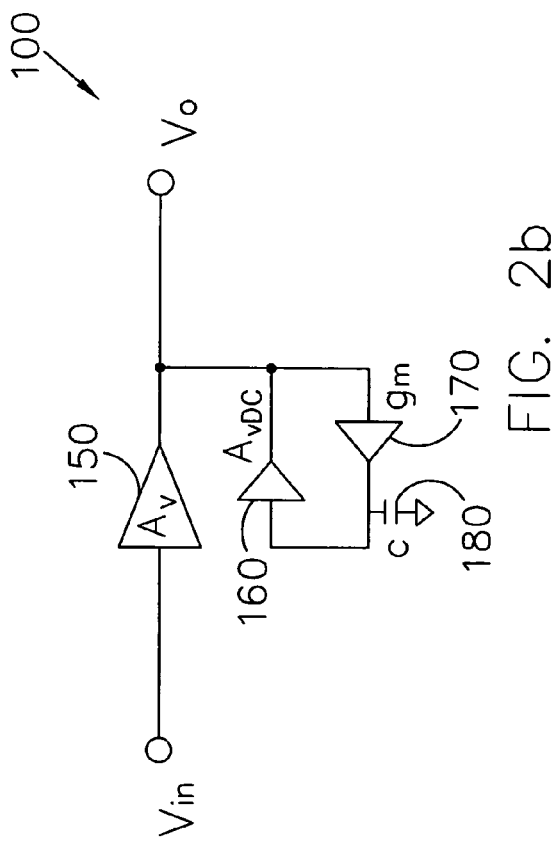
Figure 3A:
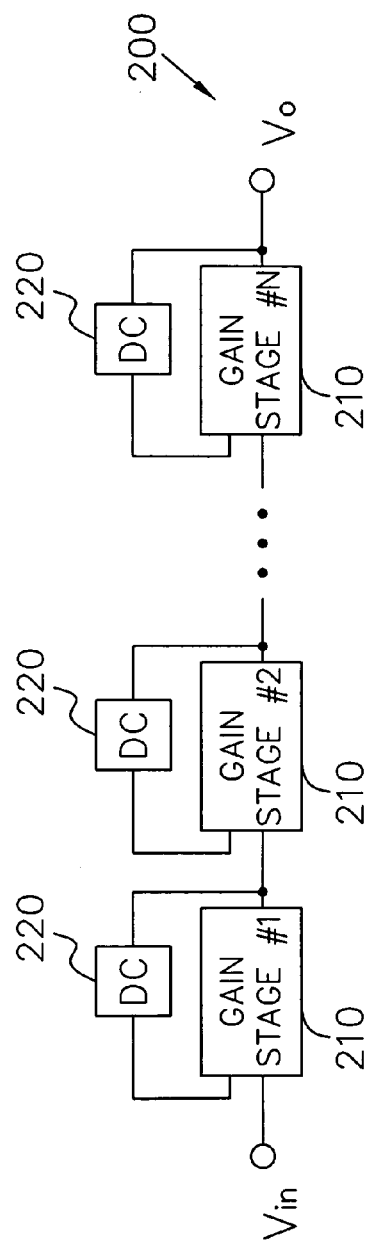
FIG. 3a is a block diagram of a DC offset cancelling circuit with a single feedback loop according to a preferred embodiment of the present invention.
Figure 3B:
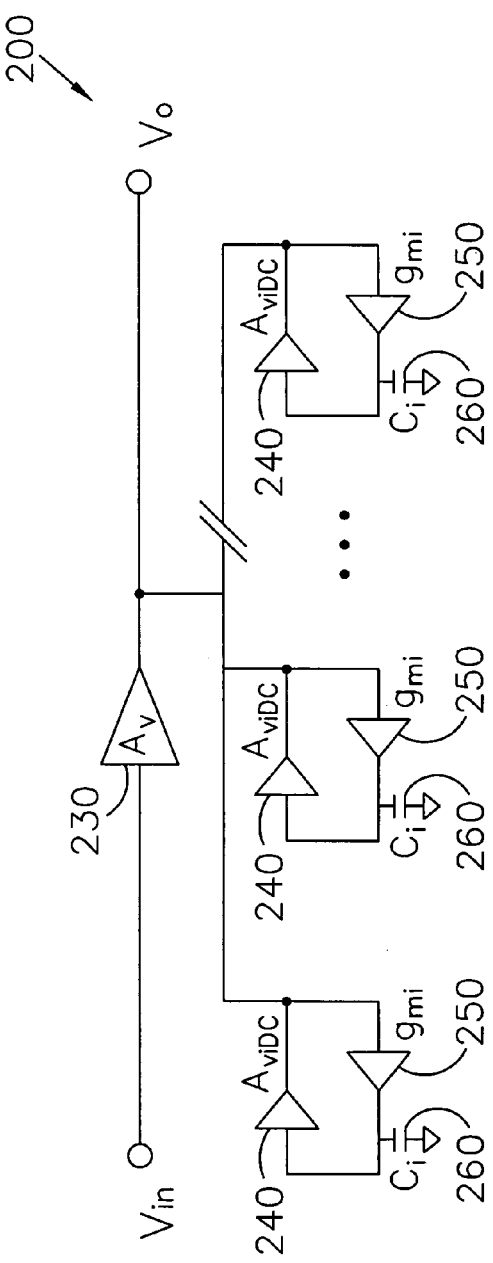

FIG. 3a is a block level diagram of a DC offset cancelling circuit 200 in accordance with a preferred embodiment of the present invention. FIG. 3b is a schematic diagram of the DC offset cancelling circuit 200 of FIG. 3a. As shown in FIGS. 3a and 3b, the DC offset cancelling circuit 200 includes a plurality of gain stages 210 connected in series. However, instead of a single servo feedback loop, each gain stage 210 has its own servo feedback loop and DC offset cancelling circuit 220 to reject the DC offset of the respective gain stage 210. In other preferred embodiments, each gain stage 210 includes a variable gain amplifier (VGA) and each DC offset cancelling circuit 220 includes a high pass filter.

An incoming signal having a voltage $V_{in}$ is amplified at each gain stage 210. Each individual gain stage 210 (i) has a gain of $A_{vi}$ and the total AGC loop gain is shown at equation 3 as:

$$A_v = \prod_i A_{vi} \qquad (3)$$

The transfer function for each gain stage 210 is:

$$\frac{sA_{vi}}{s + \frac{g_{mi}A_{vi}A_{vi,DC}}{C_i}}$$

Since the gain stages 210 are cascaded, the overall transfer function for the AGC loop 200, having a number of gain stages 210 (N), is shown at equation 4 as:

$$\frac{V_o}{V_{in}} = \left[ \frac{sA_{vi}}{s + \frac{g_{mi}A_{vi}A_{vi,DC}}{C_i}} \right]^N \qquad (4)$$

The cut-off frequency $f_{ci}$ of each gain stage is shown at equation 5 as:

$$f_{ci} = \frac{g_{mi} A_{vi} A_{vi,DC}}{2\pi C_i} \quad (5)$$

and is preferably substantially equal for best overall performance. The total capacitance value of the AGC according to this preferred embodiment is the sum of the capacitance $C_i$ for each of the number of gain stages N. The ratio of total capacitance values indicates the capacitance value required for the DC offset cancellation circuit of the preferred embodiment. This ratio is shown at equation 6 as:

$$\frac{C_r}{\sum_i C_{mi}} = \frac{A_{v,r}}{N A_{v,m}} = \frac{A_{v,m}^{N-1}}{N} \quad (6)$$

where $C_r$ represents the capacitance value for the related art DC offset cancelling circuit, and $C_m$ represents the capacitance value for the preferred embodiment of the present invention with multiple DC offset cancelling loops 220. According to the above equation (6), the numerator grows exponentially, but the denominator grows linearly as the number N of gain stages 210 increases. Thus, the total capacitance value decreases exponentially as the number N of gain stages 210 increases. Therefore, the capacitance value of the preferred embodiment of the present invention is smaller than the capacitance value of the related art circuit, by several order of magnitudes for only a moderate number of gain stages.

Another advantage of the preferred embodiment of the present invention is that the amount of DC offset rejection is larger in the preferred embodiment than in the related art single servo feedback approach. Based on equation (4), the DC offset decreases 20 dB/decade for each gain stage 220, in contrast with 20 dB/decade for all the gain stages of the entire related art single feedback loop. In other words, the amount of DC offset is about N times greater in this preferred embodiment of the present invention than in the related art approach. This provides the benefit of substantially eliminating the trade-off between the cut-off frequency and amount of DC offset rejection. The large roll-off rate of the preferred embodiments of the present invention enable the sufficient suppression of DC offset even in the case of low cut-off frequency.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A loop apparatus, comprising:
    a plurality of gain stages connected in series to amplify a radio frequency (RF) signal having a voltage, wherein each gain stage includes an input port that receives the RF signal and an output port that transmits the resulting amplified signal, and each gain stage increases the voltage of the RF signal; and
    a plurality of feedback loops where each feedback loop is coupled to the output port and the input port of a corresponding one of the gain stages and such that each gain stage is connected to a corresponding feedback loop to cancel a direct current offset voltage of its corresponding gain stage, each feedback loop including a high-pass filter that filters the direct current offset voltage accumulated by its corresponding gain stage.

2. The loop apparatus of claim 1, wherein each feedback loop includes a direct current offset canceling unit for rejecting the direct current offset voltage accumulated by its corresponding gain stage.

3. The loop apparatus of claim 2, wherein each direct current offset canceling unit includes the high-pass filter that filters the direct current offset voltage.

4. The loop apparatus of claim 1, wherein each gain stage includes a variable gain amplifier.

5. The loop apparatus of claim 1, wherein the plurality of gain stages and feedback loops are mounted on a chip, and each feedback loop includes a capacitor mounted on the chip.

6. The loop apparatus of claim 1, wherein the RF signal is an analog radio frequency signal.

7. The loop apparatus of claim 1, wherein the resulting amplified signal comprises an analog signal.

8. The loop apparatus of claim 1, further comprising a mixer that demodulates the resulting amplified signal and forms a demodulated baseband signal.

9. The loop apparatus of claim 8, further comprising an analog-to-digital converter that converts an analog signal corresponding to the resulting amplified signal to a digital data stream.

10. The loop apparatus of claim 1, wherein the loop apparatus is provided within a single amplification unit.

11. The loop apparatus of claim 1, further comprising an antenna unit to receive the RF signal.

12. The loop apparatus of claim 11, wherein the antenna unit provides the RF signal to at least a first one of the gain stages.

13. A method for controlling a gain of a radio frequency (RF) signal, comprising:
    amplifying the voltage of an RF signal by propagating the RF signal through a plurality of gain stages connected in series, wherein each gain stage increases the voltage of the RF signal, and includes an input port receiving the RF signal and an output port transmitting the resulting amplified signal; and
    canceling an undesired offset of each gain stage using a plurality of feedback loops, wherein each feedback loop is connected to the output port and the input port of a corresponding one of the gain stages, such that each gain stage is connected to a corresponding feedback loop that cancels the undesired offset of its corresponding gain stage, each feedback loop including a direct current offset canceling unit having a high-pass filter to cancel the undesired offset by its corresponding gain stage.

14. The method of claim 13, wherein the resulting amplified signal comprises an analog signal.

15. The method of claim 13, further comprising demodulating the resulting amplified signal and forming a demodulated baseband signal.

16. The method of claim 14, further comprising converting an analog signal corresponding to the resulting amplified signal to a digital data stream.

17. The method of claim 13, wherein the amplifying and canceling occur within a single amplification unit.

18. The method of claim 13, further comprising receiving the RF signal from an antenna unit.

19. A direct conversion receiver, comprising:
   an amplification unit that receives and amplifies a radio frequency (RF) signal, wherein the amplification unit includes:
   a plurality of gain stages connected in series to amplify the RF signal having a voltage, wherein each gain stage includes an input port that receives the RF signal and an output port that transmits the resulting amplified signal, and each gain stage increases the voltage of the RF signal, and
   a plurality of feedback loops where each feedback loop is coupled to the output port and the input port of a corresponding one of the gain stages and such that each gain stage is connected to a corresponding feedback loop to cancel an undesired offset of its corresponding gain stage, each feedback loop including a direct current offset canceling unit having a high-pass filter to filter a direct current offset voltage; and
   a mixer that demodulates the amplified signal by mixing the amplified RF signal with a local oscillation signal to form a demodulated baseband signal.

20. The direct conversion receiver of claim 19, further comprising an analog-to-digital converter that converts the demodulated baseband signal to a digital data stream.

21. The direct conversion receiver of claim 20, further comprising a channel selection filter that removes an out-of-band signal from the demodulated baseband signal.

22. The direct conversion receiver of claim 19, wherein the undesired offset is a direct current offset voltage, and each feedback loop includes the direct current offset canceling unit for rejecting the direct current offset voltage accumulated by its corresponding gain stage.

23. The direct conversion receiver of claim 22, wherein each direct current offset canceling unit includes the high-pass filter that filters the direct current offset voltage.

24. The direct conversion receiver of claim 19, wherein each gain stage includes a variable gain amplifier.

25. The direct conversion receiver of claim 19, wherein the plurality of gain stages and feedback loops are mounted on a chip, and each feedback loop includes a capacitor mounted on the chip.

26. The direct conversion receiver of claim 19, wherein the RF signal is an analog radio frequency signal.

27. The direct conversion receiver of claim 19, wherein the mixer receives a plurality of clock signals to generate the local oscillation signal, wherein each of the clock signals has a frequency less than the local oscillation signal.

28. The direct conversion receiver of claim 19, wherein the resulting amplified signal comprises an analog signal.

29. The direct conversion receiver of claim 19, wherein the amplification unit includes an antenna unit to receive the RF signal.

30. The direct conversion receiver of claim 29, wherein the antenna unit provides the RF signal to at least a first one of the gain stages.

* * * * *